(12) United States Patent
Yao et al.

(10) Patent No.: US 10,231,340 B2
(45) Date of Patent: Mar. 12, 2019

(54) SINGLE REFLOW POWER PIN CONNECTIONS

(71) Applicant: SEMICONDUCTOR COMPONENTS INDUSTRIES, LLC, Phoenix, AZ (US)

(72) Inventors: Yushuang Yao, Seremban (MY); Atapol Prajuckamol, Klaeng (TH); Chee Hiong Chew, Seremban (MY); Francis J. Carney, Mesa, AZ (US); Yusheng Lin, Phoenix, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 256 days.

(21) Appl. No.: 15/165,813

(22) Filed: May 26, 2016

(65) Prior Publication Data

US 2017/0347456 A1  Nov. 30, 2017

(51) Int. Cl.

| | |
|---|---|
| *H01K 3/00* | (2006.01) |
| *H05K 1/18* | (2006.01) |
| *H05K 1/02* | (2006.01) |
| *H05K 1/03* | (2006.01) |
| *H05K 1/09* | (2006.01) |
| *H05K 3/34* | (2006.01) |

(Continued)

(52) U.S. Cl.
CPC ............. *H05K 1/181* (2013.01); *H01L 23/48* (2013.01); *H05K 1/0203* (2013.01); *H05K 1/0306* (2013.01); *H05K 1/09* (2013.01); *H05K 3/341* (2013.01); *H05K 3/3494* (2013.01); *H05K 3/4015* (2013.01); *H05K 3/3431* (2013.01); *H05K 2201/10189* (2013.01); *H05K 2201/10257* (2013.01); *H05K 2201/10333* (2013.01); *H05K 2203/1316* (2013.01); *H05K 2203/1327* (2013.01); *H05K 2203/16* (2013.01); *Y10T 29/49146* (2015.01)

(58) Field of Classification Search
CPC ........... Y10T 29/49204; Y10T 29/5313; Y10T 70/5889; Y10T 29/49146; H02K 15/00; H05K 1/09; H05K 3/3494
USPC .......... 29/841, 825, 829, 832, 846, 851, 874
See application file for complete search history.

(56) References Cited

U.S. PATENT DOCUMENTS

| | | | |
|---|---|---|---|
| 6,979,204 B2 * | 12/2005 | Gobl | H01L 23/367 257/E23.078 |
| 7,758,366 B2 * | 7/2010 | Masuda | H01R 12/82 439/247 |

(Continued)

FOREIGN PATENT DOCUMENTS

EP          2086064 A1      8/2009

*Primary Examiner* — Thiem D Phan
(74) *Attorney, Agent, or Firm* — Ramey & Schwaller, LLP

(57) ABSTRACT

A method, in some embodiments, comprises: providing a direct bonded copper (DBC) substrate including a plurality of copper traces; providing a guide plate having protrusions on a surface of the guide plate; mounting hollow bush rings onto the protrusions; mounting the bush rings onto the copper traces by aligning the protrusions of the guide plate with solder units on said copper traces; attaching the bush rings and one or more dies to the copper traces by simultaneously reflowing said solder units and other solder units positioned between the dies and the copper traces; and after said simultaneous reflow, removing the protrusions from the bush rings.

6 Claims, 14 Drawing Sheets

(51) Int. Cl.
*H01L 23/48* (2006.01)
*H05K 3/40* (2006.01)

(56) References Cited

U.S. PATENT DOCUMENTS 7,867,016 B2 1/2011 Nabilek et al.
8,087,943 B2 1/2012 Stolze

* cited by examiner

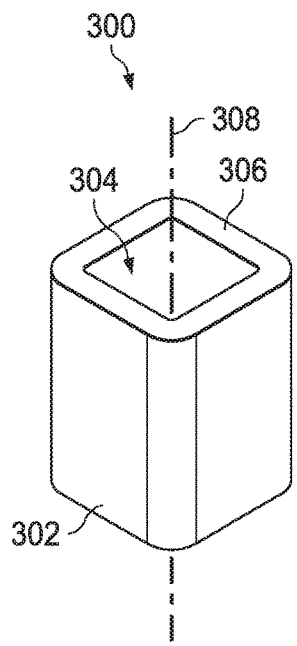
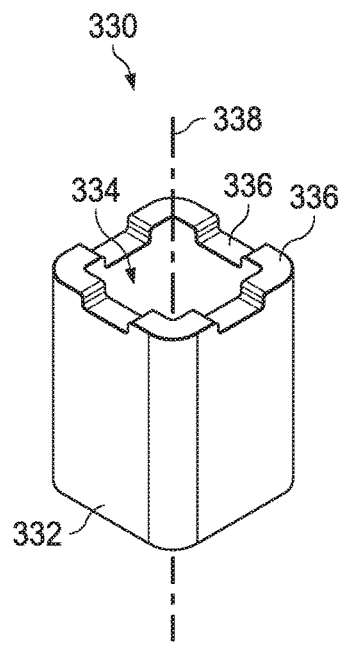
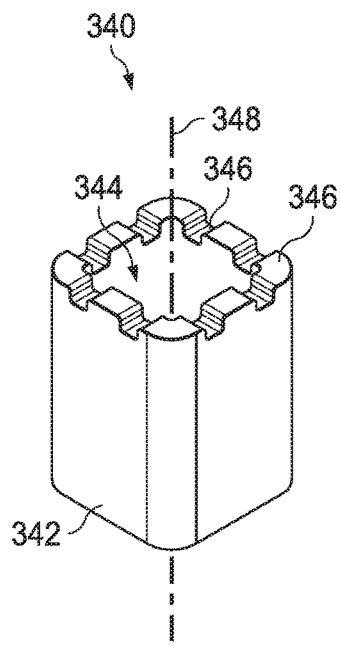
FIG. 3A      FIG. 3B      FIG. 3C
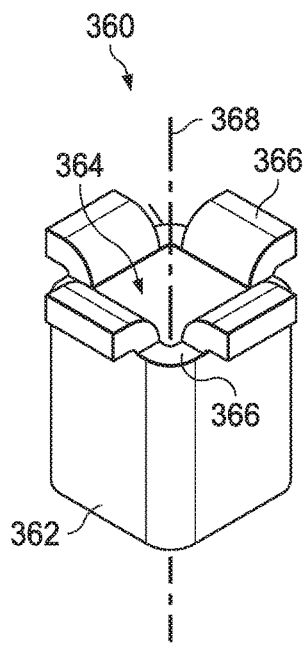
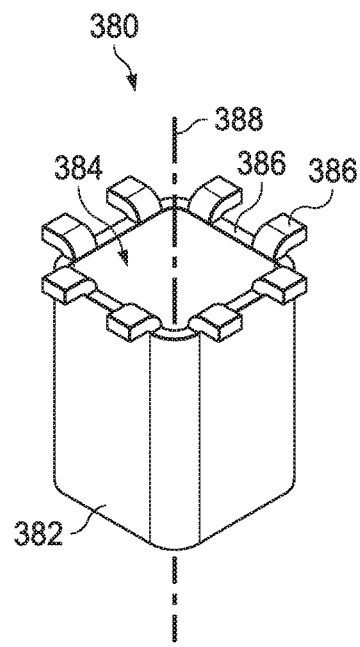
FIG. 3D      FIG. 3E

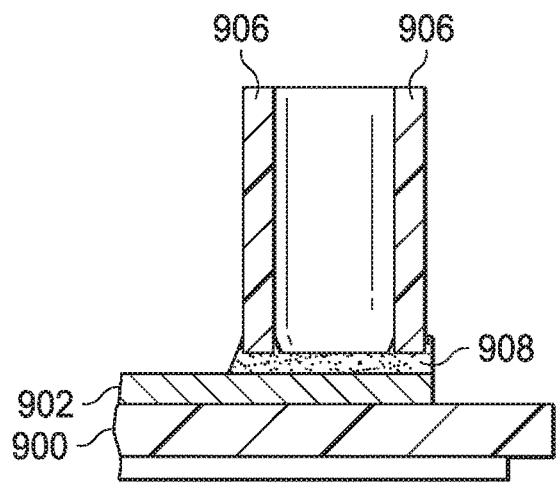
FIG. 10B
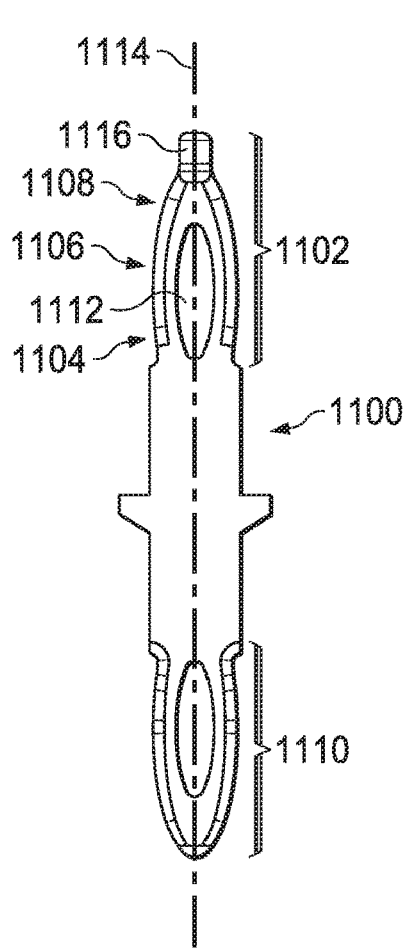 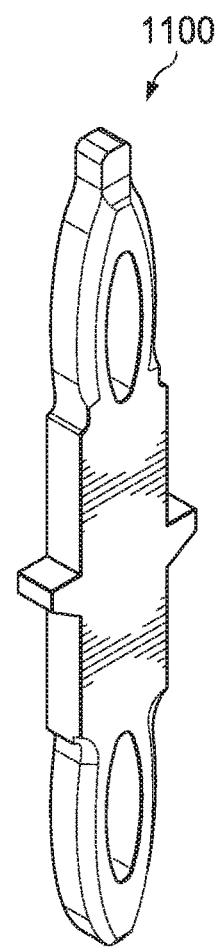
FIG. 11A FIG. 11B

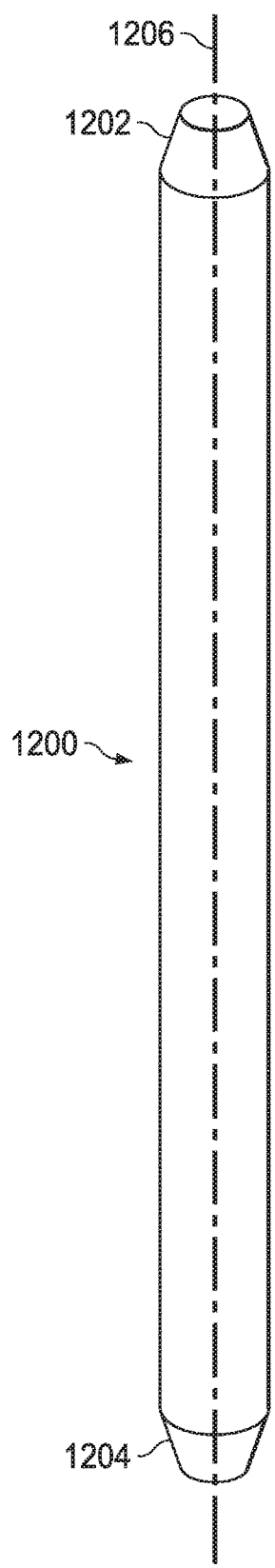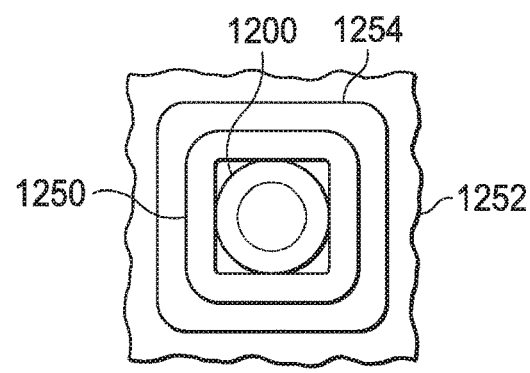
FIG. 12A
FIG. 12B

SINGLE REFLOW POWER PIN CONNECTIONS

BACKGROUND

Power integrated modules (PIMs) typically contain several power semiconductor devices. These semiconductor devices are usually dies that are soldered to metallic contacts on a substrate, such as copper traces formed on a direct bonded copper (DBC) substrate having a ceramic mid-layer. The PIMs also contain power pin rings that are soldered to the copper traces. The rings and the dies are usually soldered separately—that is, multiple reflow processes are used. An electrical pathway is thus formed between the soldered dies and pins inserted in the rings. When the dies are coupled to other electronic devices (e.g., printed circuit boards (PCBs)), communications between the electronic devices and the dies are enabled.

SUMMARY

At least some embodiments are directed to a method, comprising: providing a direct bonded copper (DBC) substrate including a plurality of copper traces; providing a guide plate having protrusions on a surface of the guide plate; mounting hollow bush rings onto the protrusions; mounting the bush rings onto the copper traces by aligning the protrusions of the guide plate with solder units on said copper traces; attaching the bush rings and one or more die to the copper traces by simultaneously reflowing said solder units and other solder units positioned between the die and the copper traces; and after said simultaneous reflow, removing the protrusions from the bush rings. These embodiments may be supplemented using one or more of the following concepts in any order and in any combination: further comprising using a vacuum system to retain the bush rings on the protrusions; further comprising disabling the vacuum system prior to removing the protrusions from the bush rings; further comprising inserting power pins into the bush rings; wherein at least one of the power pins has a dimension that exceeds an internal wall surface-to-internal wall surface dimension of a corresponding bush ring; wherein each head of one or more of the power pins has a width that is greatest in the center of the head and comprises an orifice; further comprising establishing electrical contact between said power pins and a printed circuit board (PCB); wherein at least one of the bush rings has a shape that is selected from the group consisting of: a cross-section that is substantially square when measured from outer wall surface to outer wall surface and one end that is flat, said end located in a plane that is perpendicular to the longitudinal axis of the bush ring; a cross-section that is substantially square when measured from outer wall surface to outer wall surface and one end at which the wall has multiple raised portions and multiple depressed portions, said end located in a plane that is perpendicular to the longitudinal axis of the bush ring; and a cross-section that is substantially square when measured from outer wall surface to outer wall surface and one end at which the wall has multiple raised portions and multiple depressed portions, said raised portions extending away from the longitudinal axis of the bush ring, said end located in a plane that is perpendicular to the longitudinal axis of the bush ring; further comprising depositing a molding onto the DBC, bush rings and die, a surface of the molding being flush with the end of at least one of said bush rings, said end located in a plane that is perpendicular to the longitudinal axis of the bush ring; and further comprising using a metal or plastic clip to fasten the molding to a heat sink.

At least some embodiments are directed to a system, comprising: a direct bonded copper (DBC) substrate including a ceramic layer and copper traces on a surface of the ceramic layer; hollow bush rings soldered to the copper traces; and a guide plate having protrusions mated with the bush rings, wherein each of said bush rings has an end at which the wall of the bush ring has multiple raised portions and multiple depressed portions, said end located in a plane that is perpendicular to the longitudinal axis of the bush ring. These embodiments may be supplemented using one or more of the following concepts, in any order and in any combination: wherein said ends are soldered to the copper traces; wherein said raised portions extend away from the longitudinal axis of the bush ring; wherein said raised portions are parallel to the longitudinal axis of the bush ring; wherein said bush rings have substantially square cross sections when measured from outer wall surface to outer wall surface; further comprising a die soldered to one of the copper traces; and further comprising a vacuum system having air passages positioned in the guide plate and in at least one of the protrusions.

At least some embodiments are directed to a system, comprising: a package; a plurality of pins protruding through orifices in the package; a direct bonded copper (DBC) substrate having a ceramic layer and multiple copper traces on the ceramic layer, said copper traces soldered to hollow bush rings within which said pins are positioned; and one or more die soldered to one or more of the copper traces and electrically coupled to one or more of the pins, wherein each of the bush rings has an end at which the bush ring wall has raised portions and depressed portions, said end in a plane that is perpendicular to the longitudinal axis of the bush ring, wherein said ends are soldered to the copper traces. These embodiments may be supplemented using one or more of the following concepts, in any order and in any combination: wherein each of said pins has two heads, at least one of said two heads having a tapering shape and an orifice; and wherein said raised portions of the bush ring wall extend away from the longitudinal axis of the bush ring.

BRIEF DESCRIPTION OF THE DRAWINGS

There are disclosed in the drawings and in the following description techniques for establishing power pin connections in power modules using a single reflow process. In the drawings:

FIGS. 3A-3K illustrate perspective views of various embodiments of a bush ring.

FIG. 10B is a cross-sectional view of a single bush ring soldered to a DBC substrate.

FIG. 11A shows a frontal view of a press fit power pin.

FIG. 11B is a perspective view of a press fit power pin.

FIG. 12A shows a perspective view of a round power pin.

FIG. 12B shows a top-down view of a round power pin inserted into a bush ring.

Figure 1:
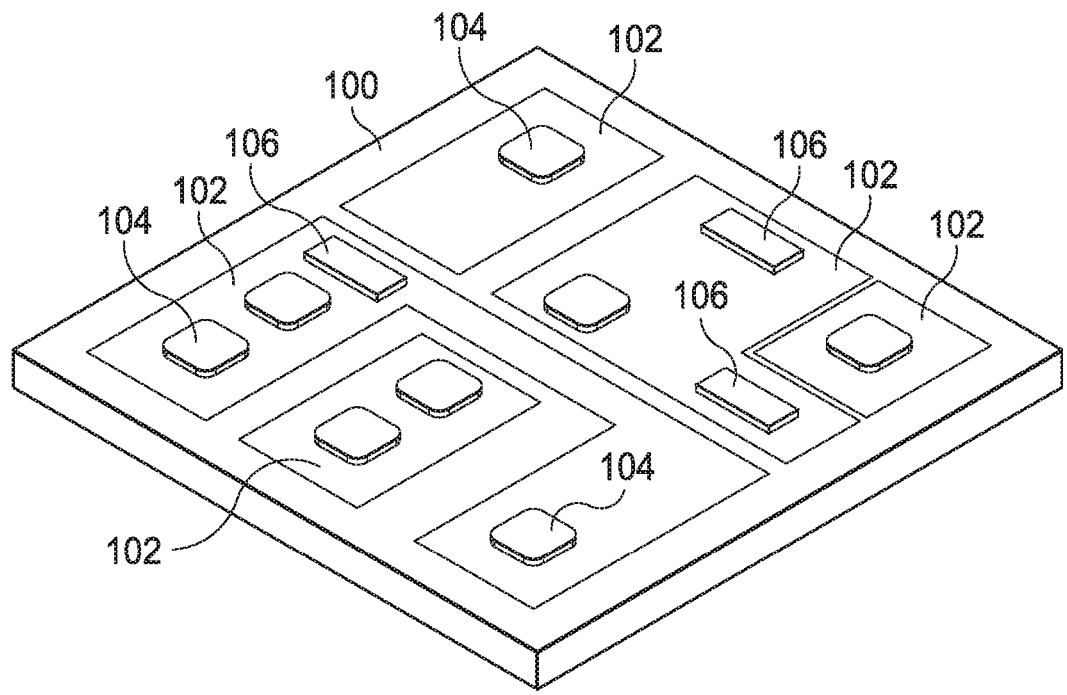
FIG. 1 shows a perspective view of a DBC substrate having copper traces to which printed solder units and dies are mounted.

It should be understood, however, that the specific embodiments given in the drawings and detailed description thereto do not limit the disclosure. On the contrary, they provide the foundation for one of ordinary skill to discern the alternative forms, equivalents, and modifications that are encompassed together with one or more of the given embodiments in the scope of the appended claims.

DETAILED DESCRIPTION

Disclosed herein is a power integrated module (PIM) that contains a direct bonded copper (DBC) substrate having a ceramic layer and copper layers formed on opposing surfaces of the ceramic layer. Semiconductor dies and hollow bush rings are mounted and simultaneously soldered to copper traces on the ceramic layer using a single reflow process. The bush rings may have shapes that enhance adhesion and electrical conductivity between the rings, the solder joint and the copper traces. The rings are mounted using specialized guide plates, as explained below. Power pins are then inserted into the bush rings, and other electronic equipment—such as printed circuit boards—may subsequently be coupled to the power pins. In this manner, reliable electrical pathways are formed between this other electronic equipment and the dies with a minimal number of reflows.

FIG. 1 shows a perspective view of a DBC substrate 100. The DBC substrate 100 includes a ceramic layer sandwiched between two copper layers. At least one of the copper layers is in the form of copper traces—specifically, copper traces 102. Solder units 104 are printed or otherwise deposited onto the copper traces 102 in various locations as desired. Dies (i.e., semiconductor chips) 106 are mounted onto solder units (not specifically shown) on the copper traces 102 in various locations as desired. The solder units 104 and the solder units sandwiched between the dies 106 and the copper traces 102 are not reflowed in the system shown in FIG. 1. The specific arrangement of copper traces, dies and solder units shown in FIG. 1 is merely illustrative and does not limit the scope of this disclosure.

Figure 2:
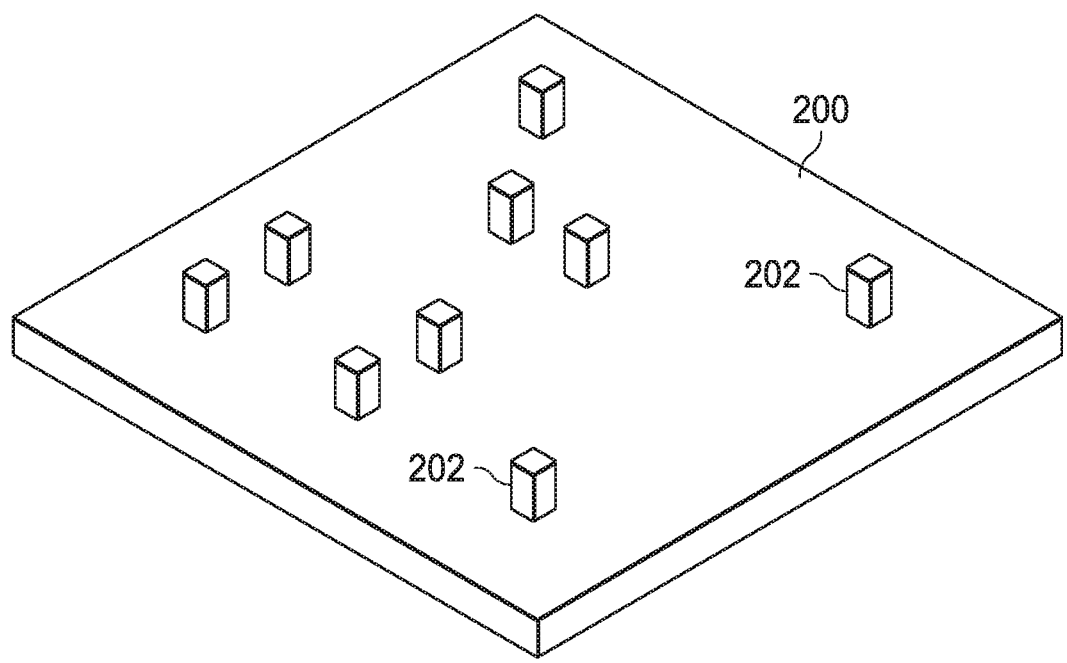
FIG. 2 shows a perspective view of a guide plate having multiple protrusions.

FIG. 2 shows a perspective view of a guide plate 200 having multiple protrusions 202. The guide plate 200 preferably is formed of one or more plastics, although virtually any material may be suitable. One purpose of the protrusions 202 is to carry hollow bush rings (described below with respect to, e.g., FIGS. 3A-3K) so that they may be mounted onto the solder units 104. Accordingly, the protrusions 202 are formed on the guide plate 200 in a pattern that is a mirror image of the solder units 104. In this way, when the guide plate 200 is "flipped over" onto the DBC substrate 100, the protrusions 202 (and the bush rings mounted thereupon) will align with the copper traces and, more specifically, with the solder units 104. Because the protrusions 202 are intended to carry the hollow bush rings described below, they are formed accordingly. Thus, the protrusions 202 have dimensions and shapes (e.g., rectangular cross-section; circular cross-section) that permit the bush rings to be mounted thereupon such that the bush rings do not easily slide off of the protrusions 202 when the guide plate 200 is flipped over. The protrusions 202 are not so large, however, that they substantially deform the bush rings or require substantial force to remove the bush rings from the protrusions 202. In at least some embodiments, each protrusion has a cross-sectional shape that matches the cross-sectional shape of a corresponding bush ring. Although the foregoing portion of the disclosure suggests that the protrusions 202 are formed as a function of the sizes and shapes of the bush rings, in some embodiments, the sizes and shapes of the protrusions 202 are static and the sizes and shapes of the bush rings are formed as a function of the sizes and shapes of the protrusions 202. All such variations are encompassed within the scope of the disclosure.

Figure 3F:
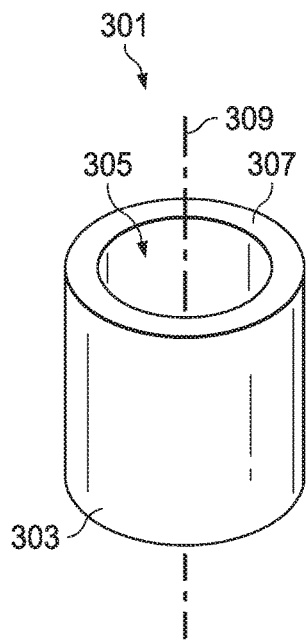

FIGS. 3A-3K illustrate perspective views of various bush ring embodiments. The bush rings in each of these figures may be formed using any suitable conductive material, such as copper. A similar material may be used in bush ring embodiments falling outside the scope of these figures. FIG. 3A shows a hollow bush ring 300 having outer wall surfaces 302, inner wall surfaces 304 and an end 306 that lies in a plane perpendicular to the longitudinal axis 308 of the bush ring 300. The bush ring 300 has a cross-section that is substantially square when measured from outer wall surface to outer wall surface and/or from inner wall surface to inner wall surface. (The term "substantially square," as used herein, means that the corners of the ring may not be precise right angles but they may instead be rounded. In addition, a ring may be "substantially square" if its cross-sectional spatial dimensions are identical or if one such dimension is within 5% of the other such dimension.) The end 306 is flat, as shown. The scope of disclosure is not limited to this particular configuration, and all variations and equivalents thereof are contemplated. For instance, the cross-sectional shape of the bush ring as determined by any measurement may be any suitable shape (e.g., circular when measured between the inner diameter surfaces or between outer diameter surfaces, as shown in FIG. 3F).

FIG. 3B shows a hollow bush ring 330 having outer wall surfaces 332, inner wall surfaces 334 and an end 336 that lies in a plane or planes perpendicular to the longitudinal axis 338 of the bush ring 330. The bush ring 330 has a cross-section that is substantially square when measured from outer wall surface to outer wall surface and/or from inner wall surface to inner wall surface. The end 336 has multiple raised portions and multiple depressed portions. In FIG. 3B, the end 336 has four raised portions at the corners of the bush ring and has four depressed portions between the raised portions. The raised portions run parallel to the longitudinal axis 338 of the bush ring 330. The scope of disclosure is not limited to this particular configuration, and all variations and equivalents thereof are contemplated.

FIG. 3C shows a hollow bush ring 340 having outer wall surfaces 342, inner wall surfaces 344 and an end 346 that lies in a plane or planes perpendicular to the longitudinal axis 348 of the bush ring 340. The bush ring 340 has a cross-section that is substantially square when measured from outer wall surface to outer wall surface and/or from inner wall surface to inner wall surface. The end 346 has multiple raised portions and multiple depressed portions. In FIG. 3C, the end 346 has eight raised portions and eight depressed portions arranged as shown. The raised portions run parallel to the longitudinal axis 348. The scope of disclosure is not limited to this particular configuration, and all variations and equivalents thereof are contemplated.

FIG. 3D shows a hollow bush ring 360 having outer wall surfaces 362, inner wall surfaces 364 and an end 366 that lies in a plane or planes perpendicular to the longitudinal axis 368 of the bush ring 360. The bush ring 360 has a cross-section that is substantially square when measured from outer wall surface to outer wall surface and/or from inner wall surface to inner wall surface. The end 366 has multiple raised portions and multiple depressed portions. Four depressed portions are positioned at the corners of the bush ring and four raised portions are positioned between the depressed portions. The raised portions are curved so that they extend away from the longitudinal axis 368 of the bush ring. The scope of disclosure is not limited to this particular configuration, and all variations and equivalents thereof are contemplated.

FIG. 3E shows a hollow bush ring 380 having outer wall surfaces 382 and inner wall surfaces 384. The bush ring 380 has an end 386 that lies in a plane or planes perpendicular to the longitudinal axis 388 of the bush ring 380. The bush ring 380 has a cross-section that is substantially square when measured from outer wall surface to outer wall surface and/or from inner wall surface to inner wall surface. The end 386 has multiple raised portions and multiple depressed portions. The raised portions are curved so that they extend away from the longitudinal axis 388 of the bush ring 380. The scope of disclosure is not limited to this particular configuration, and all variations and equivalents thereof are contemplated.

Although non-limiting, in some illustrative embodiments, the bush rings depicted in FIGS. 3A-3E have an approximate width of 1.5 mm when measured from outer wall surface to outer wall surface, a length of approximately 2.0 mm when measured from end to end, an approximate depth of 0.25 mm when measured from outer wall surface to outer wall surface, and a wall thickness of approximately 0.15-0.25 mm.

FIGS. 3F-3K depict bush rings with generally cylindrical shapes. FIG. 3F shows a hollow bush ring 301 having an outer wall surface 303 and an inner wall surface 305. The bush ring 301 has an end 307 that lies in a plane perpendicular to the longitudinal axis 309 of the bush ring 301. The bush ring 301 has a cross-section that is substantially circular when measured from opposing points on the outer wall surface or inner wall surface. The end 307 is generally flat, as shown. The scope of disclosure is not limited to this particular configuration, and all variations and equivalents thereof are contemplated.

Figure 3G:
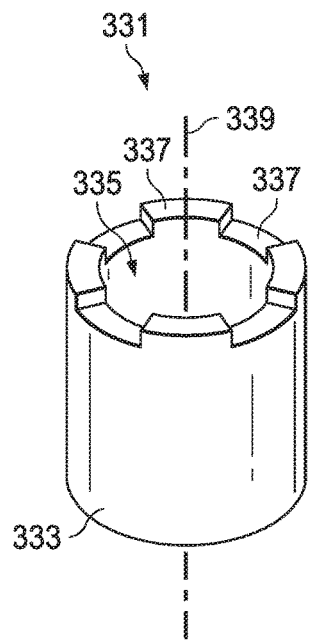

FIG. 3G shows a hollow bush ring 331 having an outer wall surface 333, inner wall surface 335 and an end 337 that lies in a plane or planes perpendicular to the longitudinal axis 339 of the bush ring 331. The bush ring 331 has a cross-section that is substantially circular when measured between opposing points on the outer wall surface or inner wall surface. The end 337 has multiple raised portions and multiple depressed portions. In FIG. 3G, the end 337 has four raised portions and four depressed portions, as shown. The raised portions run parallel to the longitudinal axis 339 of the bush ring 331. The scope of disclosure is not limited to this particular configuration, and all variations and equivalents are contemplated.

Figure 3H:
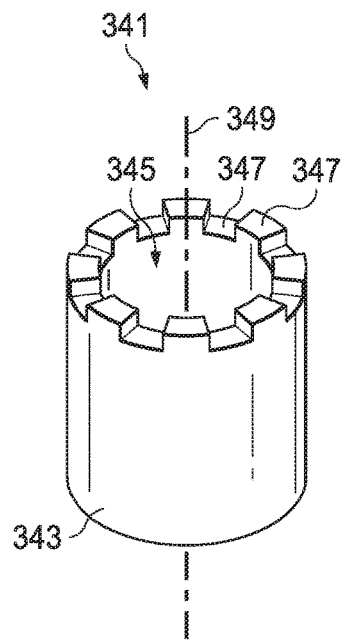

FIG. 3H shows a hollow bush ring 341 having an outer wall surface 343, an inner wall surface 345 and an end 347 that lies in a plane or planes perpendicular to the longitudinal axis 349 of the bush ring 341. The bush ring 341 has a cross-section that is substantially circular when measured between opposing points on the outer wall surface or inner wall surface. The end 347 has multiple raised portions and multiple depressed portions. In FIG. 3H, the end has eight raised portions and eight depressed portions, as shown. The raised portions run parallel to the longitudinal axis 349. The scope of disclosure is not limited to this particular configuration, and all variations and equivalents are contemplated.

Figure 3I:
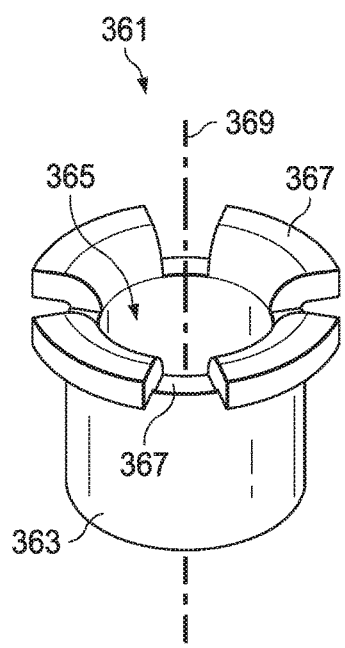

FIG. 3I shows a hollow bush ring 361 having an outer wall surface 363, an inner wall surface 365 and an end 367 that lies in a plane or planes perpendicular to the longitudinal axis 369 of the bush ring 361. The bush ring 361 has a cross-section that is substantially circular when measured from opposing points on the outer wall surface or inner wall surface. The end 367 has multiple raised portions and multiple depressed portions. The raised portions are curved so that they extend away from the longitudinal axis 369 of the bush ring. The scope of disclosure is not limited to this particular configuration, and all variations and equivalents thereof are contemplated.

Figure 3J:
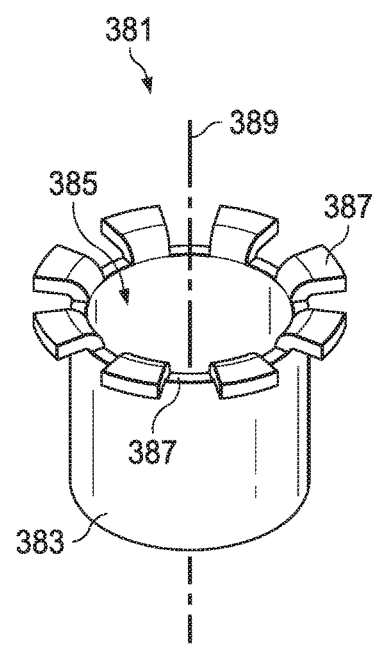

FIG. 3J shows a hollow bush ring 381 having an outer wall surface 383 and inner wall surface 385. The bush ring 381 has an end 387 that lies in a plane or planes perpendicular to the longitudinal axis 389 of the bush ring 381. The bush ring 381 has a cross-section that is substantially circular when measured from opposing points on the outer wall surface or the inner wall surface. The end 387 has multiple raised portions and multiple depressed portions. The raised portions are curved so that they extend away from the longitudinal axis 389. The raised portions are more numerous in FIG. 3J than they are in FIG. 3I. The scope of disclosure is not limited to this particular configuration, and all variations and equivalents thereof are contemplated.

Figure 3K:
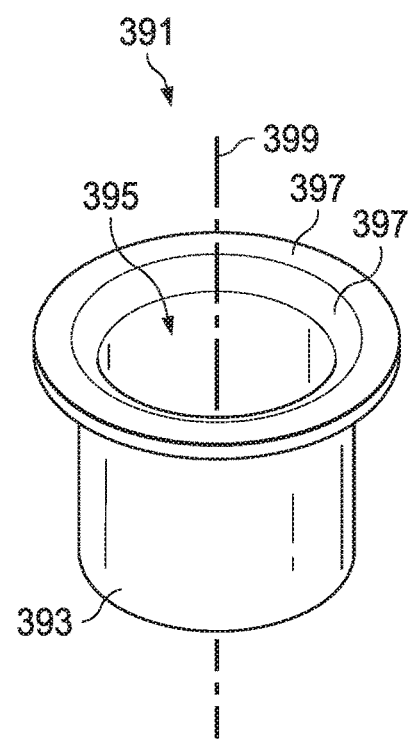

FIG. 3K shows a hollow bush ring 391 having an outer wall surface 393 and inner wall surface 395. The bush ring 391 has an end 397 that lies in a plane perpendicular to the longitudinal axis 399 of the bush ring 391. The bush ring 391 has a cross-section that is substantially circular when measured from opposing points on the outer wall surface or inner wall surface. The end 397 comprises a single, continuous, raised portion 392 that is curved so that it extends away from the longitudinal axis 399. The scope of disclosure is not limited to this particular configuration, and all variations and equivalents thereof are contemplated.

Although non-limiting, in some illustrative embodiments, the bush rings depicted in FIGS. 3F-3K have an approximate diameter of 1.5 mm when measured from outer wall surface to outer wall surface, a length of approximately 2.0 mm when measured from end to end, and a wall thickness of approximately 0.15-0.25 mm.

Figure 4:
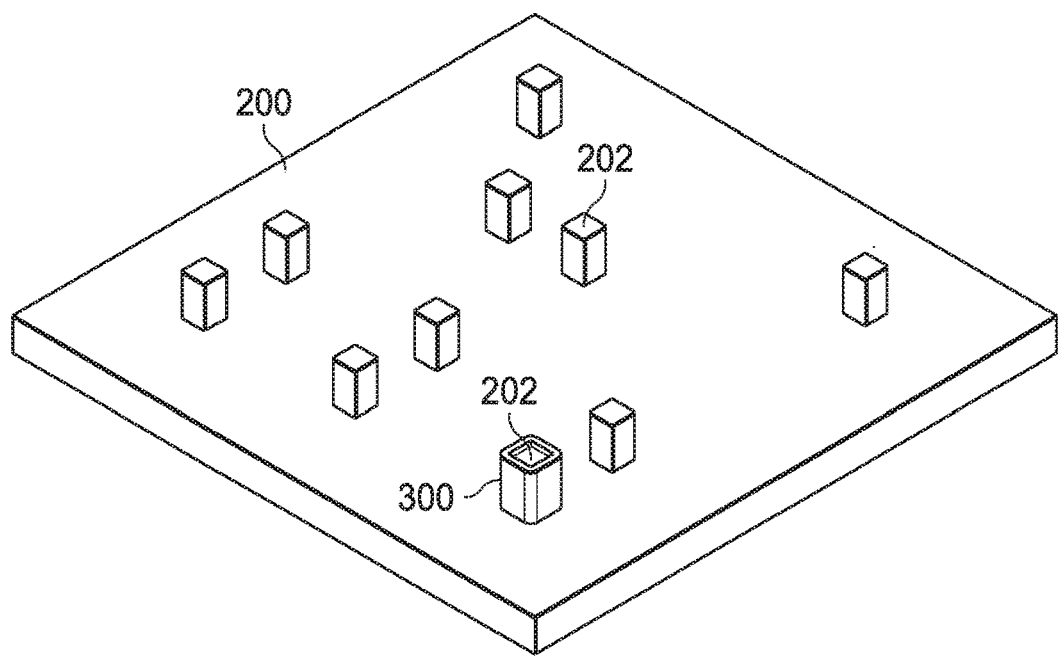
FIG. 4 shows a perspective view of a guide plate having multiple protrusions, one of which has a bush ring mounted thereupon.

FIG. 4 shows a perspective view of a guide plate 200 having protrusions 202, one of which has a bush ring 300 mounted thereupon. The bush ring 300 in this particular example is the same as that shown in FIG. 3A, although other types of bush rings (e.g., those shown in FIGS. 3B-3K) also may be used in lieu of or in combination with the bush ring 300, depending on the shapes of the protrusions 202.

Figure 5A:
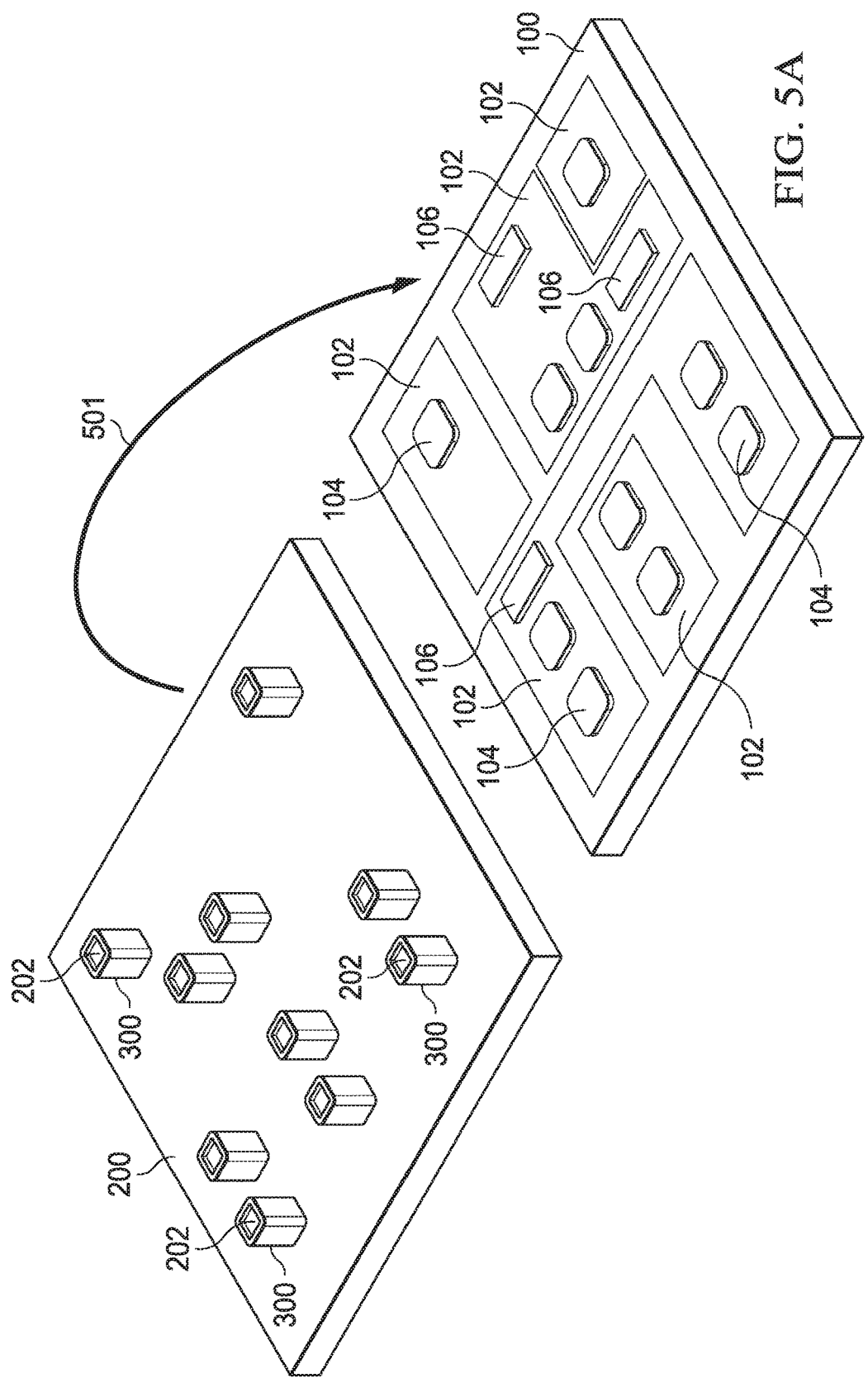
FIG. 5A illustrates a perspective view of a guide plate having multiple bush rings being flipped onto a DBC substrate so that the bush rings contact the solder units printed on the DBC substrate copper traces.

FIG. 5A illustrates a perspective view of the guide plate 200 having multiple bush rings 300 mounted on protrusions 202. It also illustrates the DBC 100 having copper traces 102 upon which solder units 104 and dies 106 are positioned. As arrow 501 indicates, the guide plate 200 is flipped over the DBC 100 so that the protrusions 202—and, more specifically, the bush rings 300—are aligned with the solder units 104 on the copper traces 102. As described below, once the guide plate 200 is flipped over onto the DBC 100, a single reflow process is performed so that the solder units 104 and the solder positioned between the dies 106 and the copper traces 102 (not specifically shown) are simultaneously reflowed. As previously explained, the protrusions 202 are formed on the guide plate 200 so that when the guide plate 200 is flipped, the protrusions can be aligned with the solder units 104. Alternatively, the solder units 104 are printed in locations that can be aligned with the protrusions 202 of a corresponding guide plate 200. All such variations are included in the scope of this disclosure.

Figure 5B:
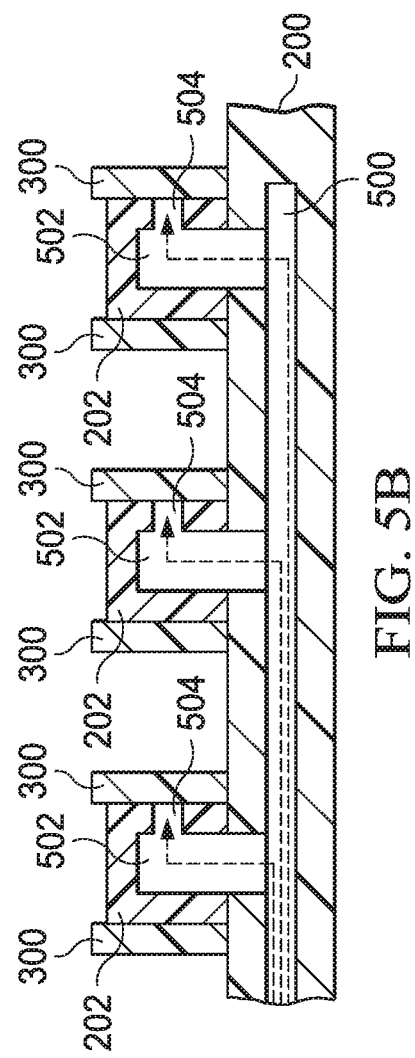
FIG. 5B shows a cross-sectional view of a guide plate vacuum system.

FIG. 5B shows a cross-sectional view of a guide plate vacuum system. In some cases, the bush rings 300 may have a tendency to slip off of the protrusions 202 due to gravitational force when the guide plate 200 is flipped. This tendency may be mitigated at least in part by properly sizing the bush rings 300 and/or the protrusions 202. In addition or in the alternative, a vacuum system may be formed within the guide plate 200 and protrusions 202 to suction the bush rings 300 to mitigate slippage during the flipping process. The vacuum system comprises tubing 500 in the main body of the guide plate 200, peripheral tubing 502 in the protrusions 202 and orifices 504 in the surfaces of the protrusions 202 through which suction may be applied to the bush rings 300. The tubing 500 in the main body of the guide plate 200 may terminate at an orifice in any suitable location on the guide plate 200 and may be coupled to a suitable suctioning device external to the guide plate 200. The orifice is formed to mate with tubing that couples to such a suctioning device. The vacuum system of the guide plate 200 is not limited to the specific configuration shown in FIG. 5B. All variations and equivalents are contemplated and fall within the scope of this disclosure.

Figure 6:
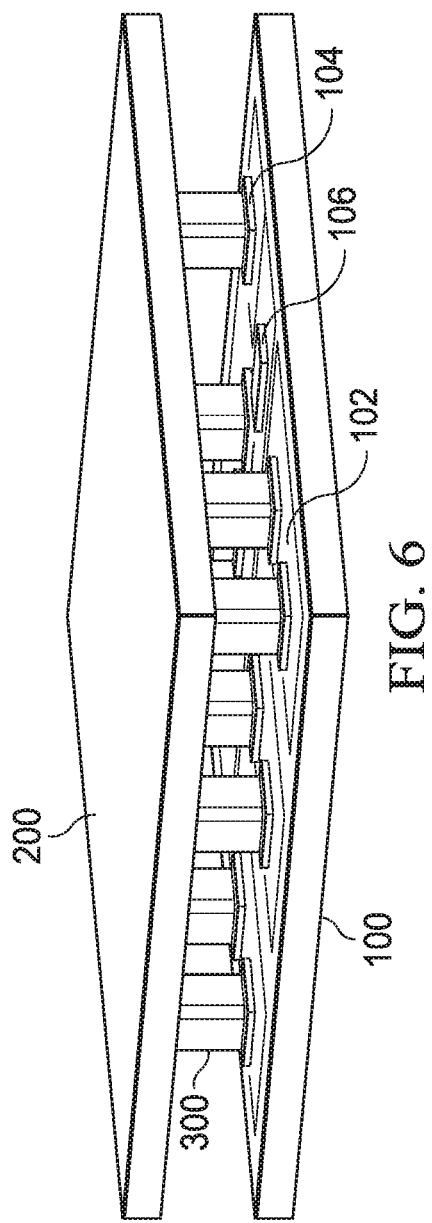
FIG. 6 shows a perspective view of a DBC substrate having multiple bush rings and dies simultaneously soldered thereto, the bush rings mounted on guide plate protrusions.

FIG. 6 shows a perspective view of a DBC substrate 100 having multiple bush rings 300 and dies 106 simultaneously soldered to copper traces 102. The bush rings 300 are mounted on guide plate protrusions (not specifically shown in FIG. 6). As explained, because the bush rings 300 and dies 106 are simultaneously soldered to the copper traces 102, only a single reflow process is required. The guide plate 200 and protrusions are subsequently removed. The solder connection between the bush rings 300 and the copper traces 102 is sufficiently strong so that the force applied to remove the protrusions from the bush rings 300 does not cause the bush rings 300 to become disconnected from the copper traces 102.

Figure 7:
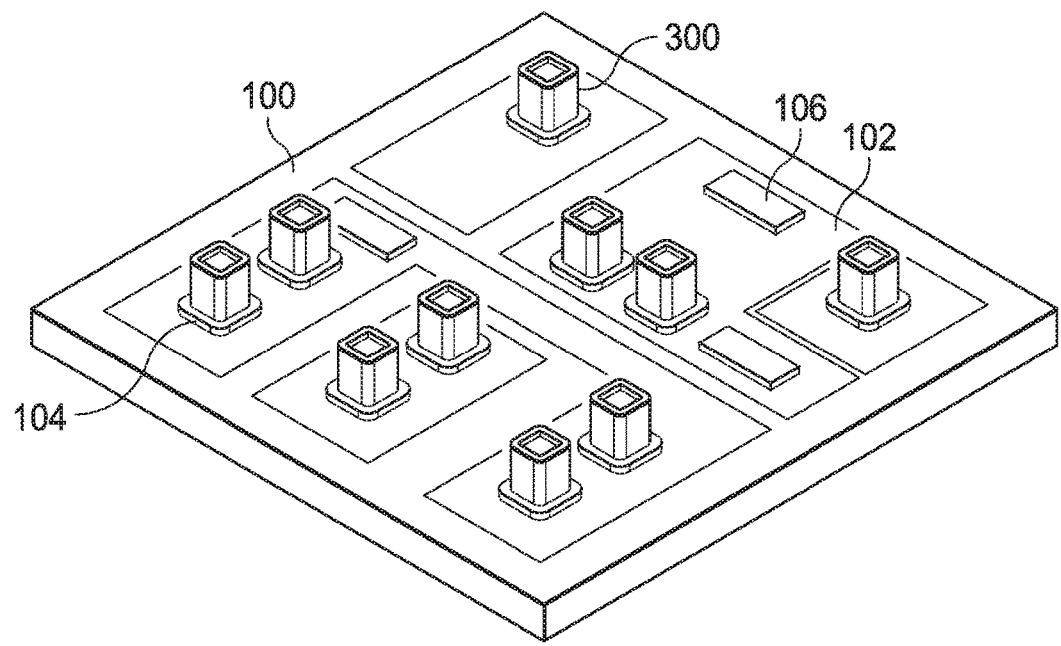
FIG. 7 shows a DBC substrate having multiple bush rings and dies simultaneously soldered thereto.

FIG. 7 shows the DBC substrate 100 having multiple bush rings 300 and dies 106 simultaneously soldered to copper traces 102. After the bush rings 300 are soldered to the copper traces 102 (as indicated by solder units/joints 104), the guide plate 200 and protrusions 202 are removed, leaving the structure shown in FIG. 7. At this stage, the dies 106 may be electrically coupled to various copper traces (and, thus, to the bush rings mounted on those traces) using any suitable electrical connections (e.g., wire bonds) as desired.

Figure 8:
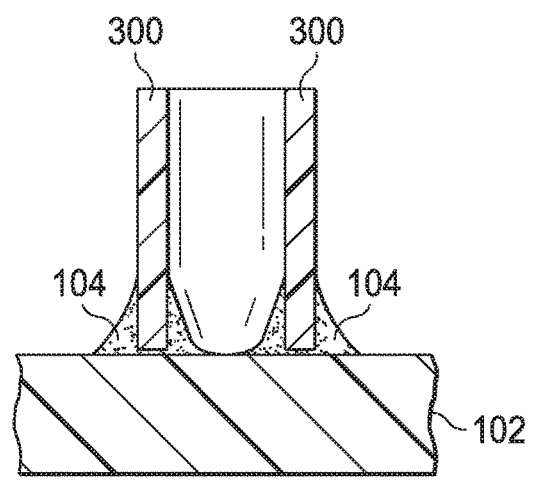
FIG. 8 is a cross-sectional view of a bush ring soldered to a DBC substrate.

FIG. 8 is a cross-sectional view of a bush ring 300 soldered to a copper trace 102 of the DBC substrate 100. The solder unit/joint 104 electrically and mechanically couples the bush ring 300 to the copper trace 102.

Figure 9:
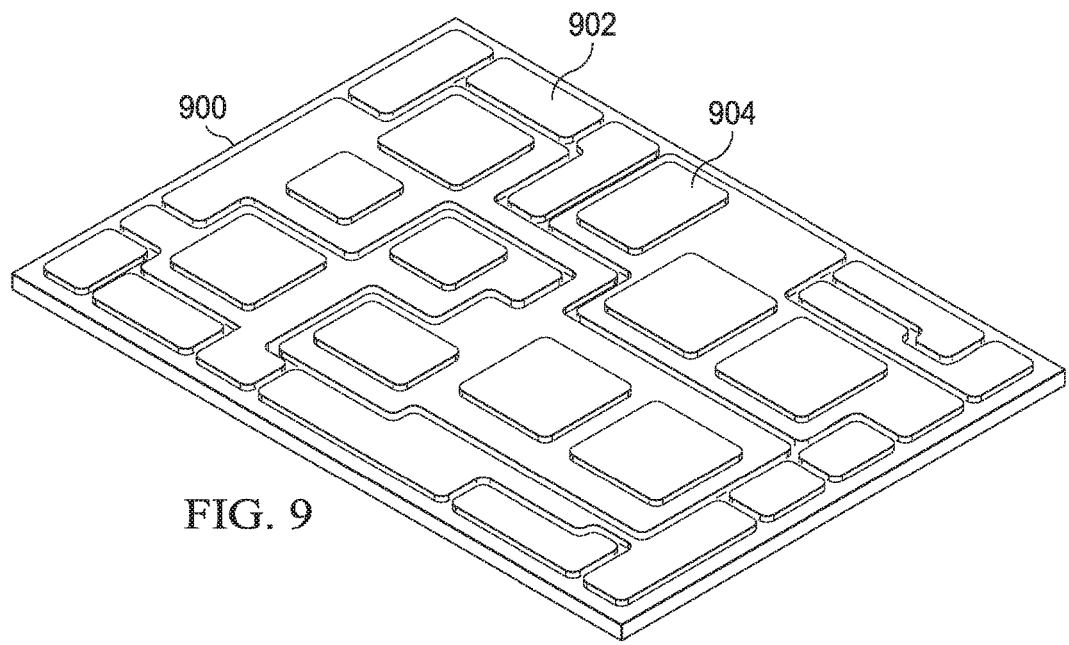
FIG. 9 is a perspective view of an illustrative set of dies mounted on a DBC substrate.
Figure 10A:
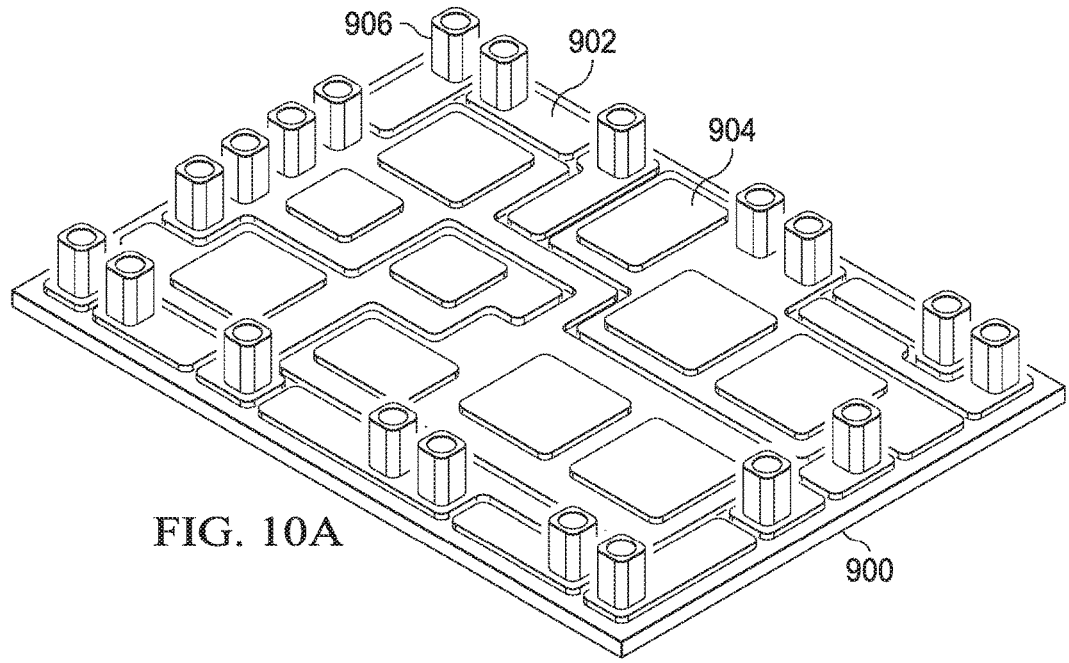
FIG. 10A is a perspective view of a DBC substrate having multiple dies and bush rings simultaneously soldered thereto.

FIG. 9 is a perspective view of another illustrative set of dies 904 mounted on copper traces 902 which, in turn, are formed on the ceramic layer of a DBC substrate 900. As with the system shown in FIG. 5A, a guide plate having protrusion-mounted bush rings is flipped over onto the copper traces 902 and is subsequently removed after a single reflow process, leaving the structure shown in FIG. 10A. Specifically, FIG. 10A shows the DBC substrate 900 on which copper traces 902 are formed. Dies 904 and bush rings 906 were simultaneously soldered to the copper traces 902. FIG. 10B is a cross-sectional view of a single bush ring 906 soldered to a copper trace 902 of the DBC substrate 900. The solder joint 908 mechanically and electrically couples the bush ring 906 to the copper trace 902. As explained, the solder joint 908 is formed simultaneously with joints between dies and the copper trace(s) during a single reflow process.

FIG. 11A shows a frontal view of a press fit power pin 1100 that may be inserted into any of the bush rings described herein. The pin 1100 has a head 1102 with a tapering shape—i.e., it has a width that is greatest in the center 1106 of the head 1102 and is lesser in the proximal area 1104 and distal area 1108 of the head 1102. The head 1102 also comprises an orifice 1112 that extends along the longitudinal axis 1114 of the pin 1100. The head 1102 further includes a distal tip 1116 that may be included in one head, both heads (e.g., the tip is omitted from opposing head 1110) or neither head. The pin 1100 is appropriately sized relative to the bush ring in which it will be inserted so that the pin 1100 and bush ring maintain electrical contact and so that the pin 1100 is adequately mechanically coupled to the bush ring. In at least some embodiments, the head of the pin 1100 that is to be inserted into the bush ring has a larger dimension than at least one dimension of the bush ring such that the bush ring deforms (e.g., by 1 mm-2 mm) upon insertion of the pin. FIG. 11B shows a perspective view of the power pin 1100.

FIG. 12A shows a perspective view of a round-head power pin 1200. The heads 1202, 1204 may be shaped as shown—i.e., to conically taper and terminate with a flat end that is in a plane perpendicular to the longitudinal axis 1206 of the pin 1200. In alternative embodiments, round ends are used in lieu of flat ends. Any and all variations and equivalents of such heads are contemplated and fall within the scope of this disclosure. As with the pin 1100, the pin 1200 is appropriately sized relative to the bush ring in which it will be inserted so that the pin 1200 and bush ring maintain electrical contact and so that the pin 1200 is adequately mechanically coupled to the bush ring. In at least some embodiments, the head of the pin 1200 that is to be inserted into the bush ring has a larger dimension than at least one dimension of the bush ring such that the bush ring deforms (e.g., by 1 mm-2 mm) upon insertion of the pin. FIG. 12B shows a top-down view of a power pin 1200 inserted into a bush ring 1250 with adequate mechanical and electrical contact. As shown, the bush ring 1250 has a substantially square cross-sectional shape and is electrically and mechanically coupled to a copper trace 1252 via a solder unit 1254. As also shown, the diameter of the pin 1200 slightly exceeds the dimensions of the bush ring 1250 so that the bush ring 1250 is slightly deformed. This ensures adequate mechanical coupling between pins and bush rings.

Figure 13:
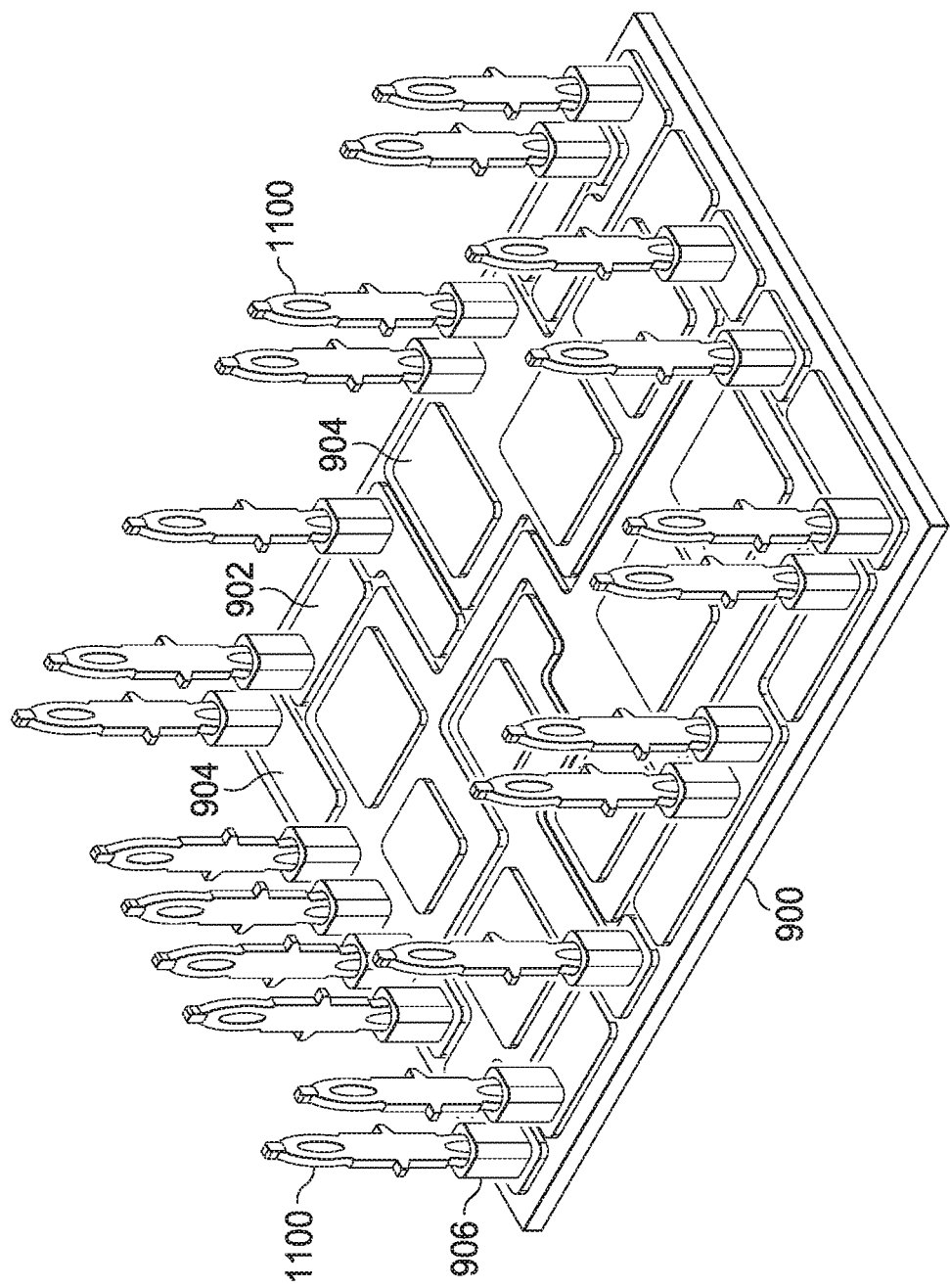
FIG. 13 is a perspective view of a DBC substrate upon which multiple dies and bush rings are simultaneously soldered and of press fit power pins that are mated with the bush rings.

FIG. 13 is a perspective view of a DBC substrate 900 having copper traces 902 upon which multiple dies 904 and bush rings 906 are simultaneously soldered and of press fit power pins 1100 that are mated with the bush rings 906. The pins 1100 may be coupled with other electronic equipment—for instance, a printed circuit board that is lowered onto the pins 1100 and that contains orifices through which the pins 1100 may pass. Such orifices may contain electrical pathways around their periphery so that they can establish electrical contact with the power pins 1100. The scope of disclosure, however, is not limited to coupling any particular type of electronic equipment to the power pins 1100.

Figure 14:
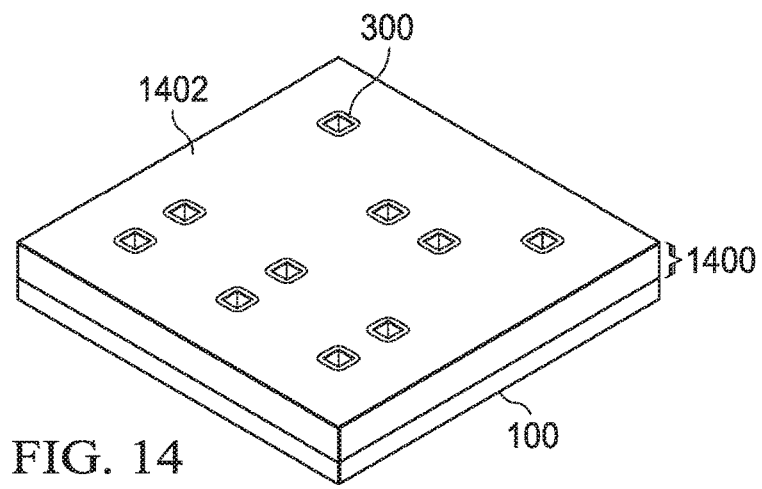
FIG. 14 is a perspective view of the system shown in FIG. 7 with a map molding.

FIG. 14 is a perspective view of the system shown in FIG. 7 with a map molding 1400 that is formed using well-known techniques (e.g., using suitable flat mold chases). The mold 1400 is formed after all necessary or desired structural features are complete—for instance, any necessary wire bond couplings between dies and copper traces are established prior to forming the mold. The mold 1400 is made of any suitable material (e.g., an epoxy resin, SUMITOMO® G760, HITACHI® CEL9220) and has dimensions that are a function of the system of FIG. 7. More specifically, the length and width of the mold 1400 match the length and width of the DBC substrate 100. The top surface 1402 of the mold 1400 is flat and the thickness of the mold 1400 is such that the top surface 1402 is flush with the top ends of the bush rings 300, as shown. Other types of molds and other mold formation techniques are known, contemplated and fall within the scope of the disclosure.

Figure 15:
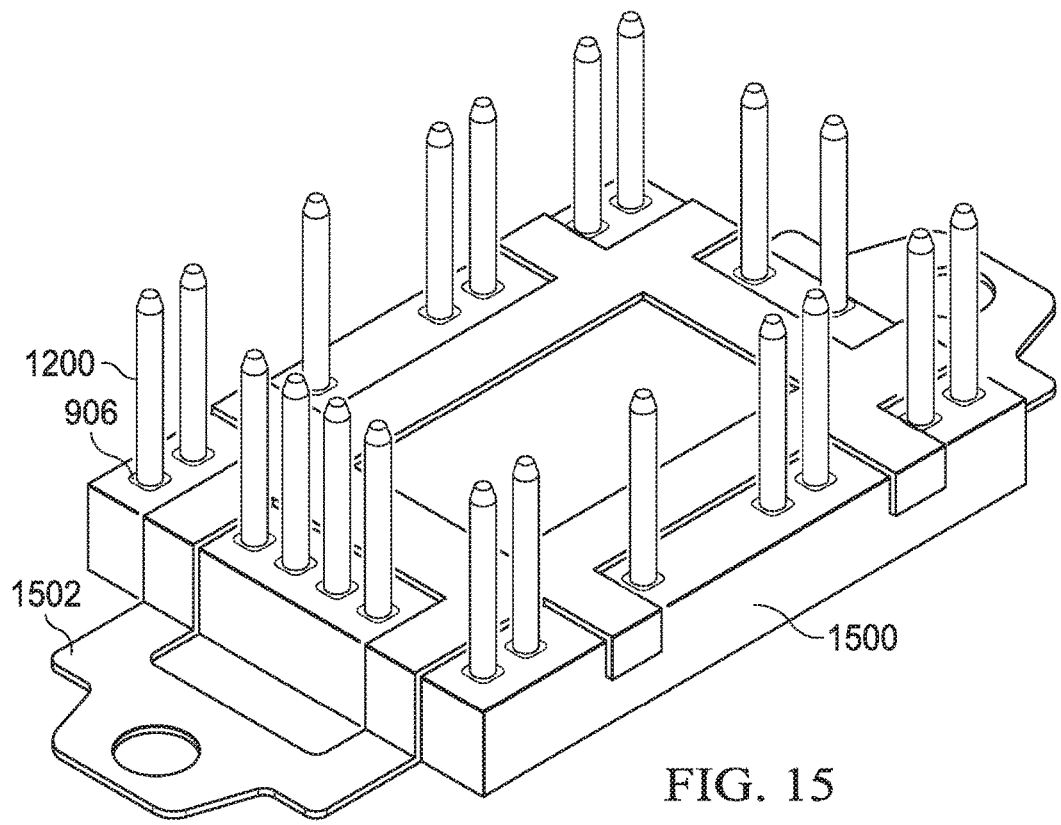
FIG. 15 is a perspective view of the system of FIG. 10A with a map molding and a clip.

A similar map molding may be applied to the system of FIG. 10A, as shown in FIG. 15. Specifically, FIG. 15 shows a map molding 1500 applied to the system of FIG. 10A so that it covers the entirety of the system and does not leave substrate 900 exposed. Power pins—for instance, round top power pins 1200—may be inserted into the bush rings 906. As is also shown, a metal or plastic clip 1502 may be mounted on the mold 1400 and may subsequently be used to mechanically fasten the structure to another component, such as a heat sink. A metal or plastic clip may also be used with the map molding system of FIG. 14. Furthermore, although FIG. 15 depicts the use of round top power pins 1200, other types of pins, such as press fit power pins, may be used instead.

Figure 16:
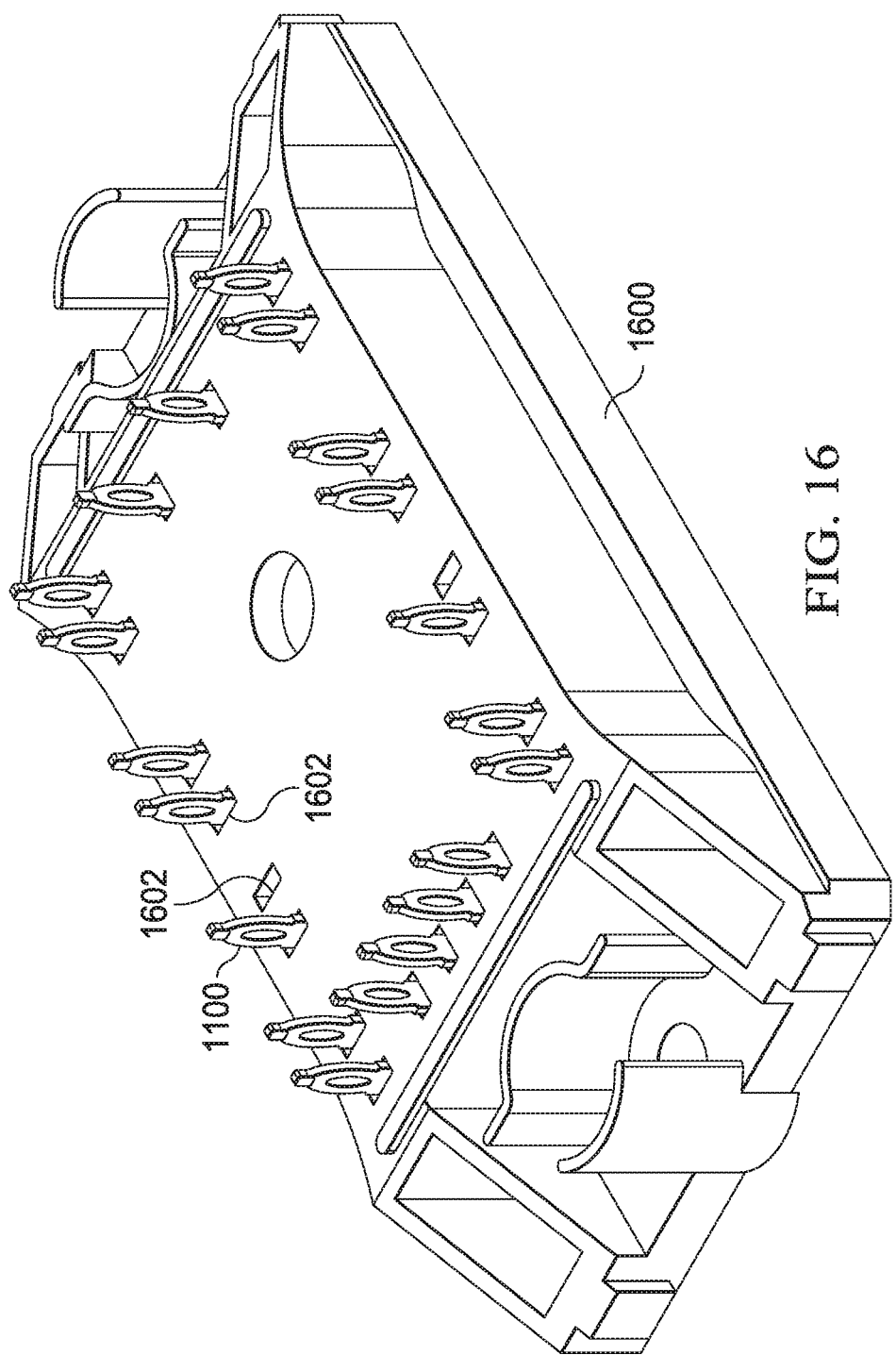
FIG. 16 is a perspective view of a package containing a DBC substrate having multiple dies, bush rings and press fit power pins.

FIG. 16 is a perspective view of a package 1600 containing a DBC substrate having multiple dies, bush rings and press fit power pins 1100. The pins 1100 protrude through the orifices 1602 of the package 1600. The package 1600 preferably is composed of a non-conducting material (e.g., one or more plastics). The package 1600 may be mounted directly over the substrate, dies and bush ring assembly or the assembly may first be map molded as shown in FIG. 15 prior to mounting the package 1600. The structural features of the package 1600 are application-specific and may be formed as desired.

Figure 17:
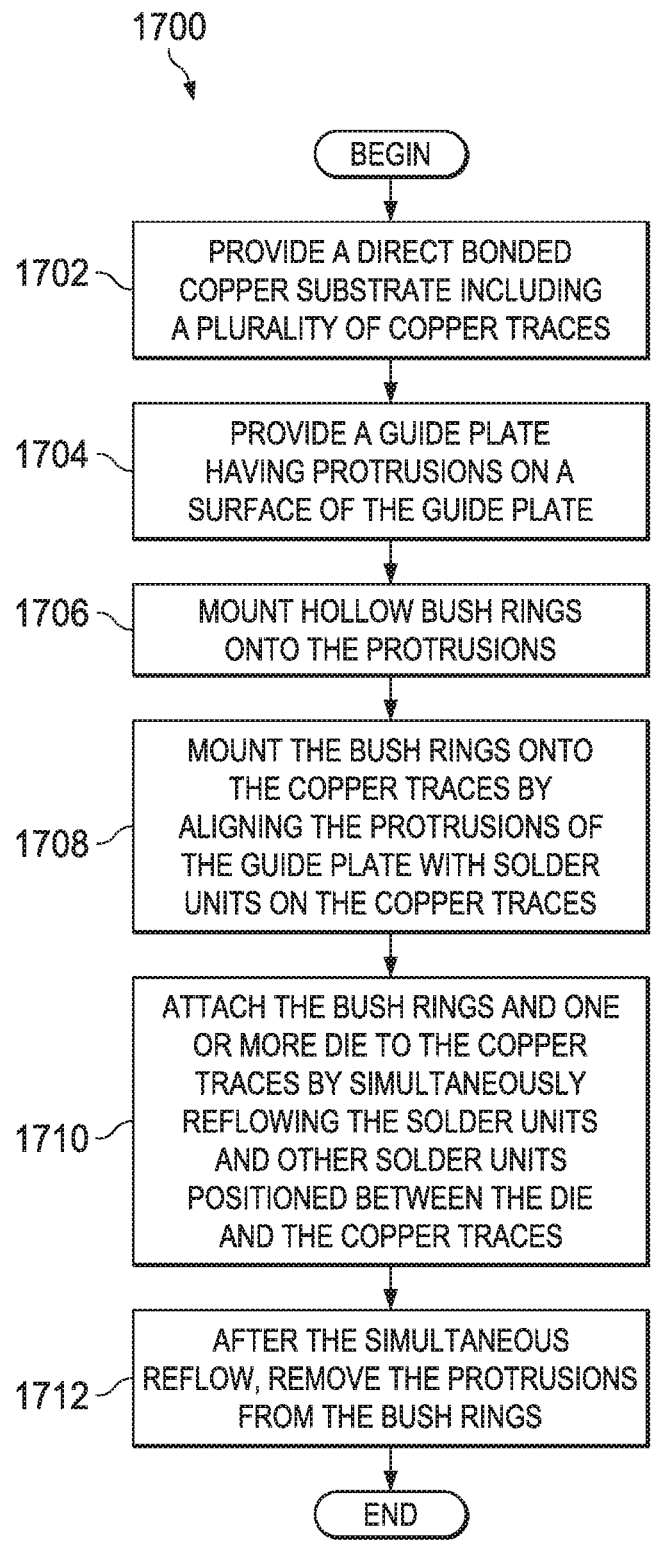
FIG. 17 is a flow diagram describing a single reflow technique for assembling power modules.

FIG. 17 is a flow diagram describing a single reflow technique 1700 for assembling power modules. The method 1700 includes providing a direct bonded copper (DBC) substrate that includes a plurality of copper traces (step 1702). As explained, such a DBC substrate typically includes a ceramic layer sandwiched between two copper layers, at least one of which includes multiple copper traces suitable for carrying electrical signals. The method 1700 next includes providing a guide plate having protrusions on a surface of the guide plate (step 1704). The protrusions' sizes and shapes are application-specific and are determined based on the sizes and shapes of the corresponding bush rings that are to be mounted on the protrusions. Alternatively, the bush rings' sizes and shapes are determined based on the protrusions' sizes and shapes. The method 1700 further includes mounting the hollow bush rings onto the protrusions (step 1706). In at least some embodiments, the bush rings maintain their position on the protrusions using a vacuum system built into the guide plate and protrusions. If used, such a vacuum system is activated when the bush rings are mounted onto the protrusions and is not deactivated until the bush rings have been securely soldered to the copper traces. The method 1700 subsequently comprises mounting the bush rings onto the copper traces by aligning the protrusions (or bush rings) of the guide plates with the copper traces—and, more specifically, with solder units deposited on the copper traces (step 1708). The method 1700 includes attaching the bush rings and one or more dies to the copper traces by simultaneously reflowing the solder units between the bush rings and copper traces and between the dies and copper traces (step 1710). Finally, after the simultaneous reflow, the guide plate and protrusions are removed from the bush rings (step 1712). The method 1700 may be modified as desired, such as by adding, deleting or modifying steps. For instance, power pins may be inserted into the bush rings, wire bonds may be established between dies and copper traces, map molding may be formed on the DBC substrate/bush ring/die structure, a package may be formed around the structure, and/or a printed circuit board may be coupled to the power pins.

Numerous other variations and modifications will become apparent to those skilled in the art once the above disclosure is fully appreciated. It is intended that the following claims be interpreted to embrace all such variations, modifications and equivalents. In addition, the term "or" should be interpreted in an inclusive sense.

What is claimed is:

1. A system, comprising:
  a direct bonded copper (DBC) substrate including a ceramic layer and copper traces on a surface of the ceramic layer;
  hollow bush rings soldered to the copper traces;
  a guide plate having protrusions mated with the bush rings, each of said bush rings having an end at which the wall of the bush ring has multiple raised portions and multiple depressed portions, said end located in a plane that is perpendicular to the longitudinal axis of the bush ring; and
  a vacuum system having air passages positioned in the guide plate and in at least one of the protrusions.

2. The system of claim 1, wherein said ends are soldered to the copper traces.

3. The system of claim 1, wherein said raised portions extend away from the longitudinal axis of the bush ring.

4. The system of claim 1, wherein said raised portions are parallel to the longitudinal axis of the bush ring.

5. The system of claim 1, wherein said bush rings have substantially square cross sections when measured from outer wall surface to outer wall surface.

6. The system of claim 1, further comprising a die soldered to one of the copper traces.

* * * * *